United States Patent
Matsumoto et al.

[11] Patent Number: 6,069,060
[45] Date of Patent: *May 30, 2000

[54] METHOD OF MANUFACTURING A SEMICONDUCTOR DEVICE HAVING A SINGLE CRYSTAL SILICON ELECTRODE

[75] Inventors: Masami Matsumoto; Junichi Tsuchimoto; Kiyoshi Mori, all of Tokyo, Japan

[73] Assignee: Mitsubishi Denki Kabushiki Kaisha, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/976,597

[22] Filed: Nov. 24, 1997

[30] Foreign Application Priority Data

May 21, 1997 [JP] Japan ................................ 9-131042

[51] Int. Cl.⁷ ............................................. H01L 21/8242

[52] U.S. Cl. ........................ 438/486; 438/253; 438/258; 438/666

[58] Field of Search .................................. 438/253–256, 438/393–396, 486, 489, 666

[56] References Cited

U.S. PATENT DOCUMENTS

| | | |
|---|---|---|
| 5,372,962 | 12/1994 | Hirota et al. . |
| 5,557,121 | 9/1996 | Kozuka et al. ......................... 257/292 |
| 5,582,640 | 12/1996 | Okada et al. . |
| 5,739,563 | 4/1998 | Kawakubo et al. ..................... 257/295 |

*Primary Examiner*—Jey Tsai
*Attorney, Agent, or Firm*—McDermott, Will & Emery

[57] ABSTRACT

It is an object to obtain a semiconductor device free from a necessity of stacking a contact hole and a lower electrode, thus preventing occurrence of an error in stacking and enabling the capacitor to be formed precisely. Amorphous silicon 10*b* is deposited on a interlayer insulating film 9 including the inside portion of the contact hole 9*a*, and then a resist 14 is applied to the amorphous silicon 10*b*. Then, a mask for photolithography which has been used to form the contact hole 9*a* is used to perform a photolithography process to form the resist 14 to have a required shape. Then, implantation of phosphorus ions is performed such that the resist 14 is used as a mask 14*a* for preventing implantation of ions. Then, the amorphous silicon 10*b* is subjected to heat treatment to partially single crystallize the amorphous silicon 10*b* so that single crystal silicon 10*c* is grown. The difference in the etching rate between the amorphous silicon 10*b* and the single crystal silicon 10*c* is used to selectively remove the amorphous silicon 10*b* by using dry etching technique so that a storage node 10 is formed.

16 Claims, 10 Drawing Sheets

METHOD OF MANUFACTURING A SEMICONDUCTOR DEVICE HAVING A SINGLE CRYSTAL SILICON ELECTRODE

BACKGROUND OF THE INVENTION

1. Field of the Invention

The present invention relates to a method of manufacturing a semiconductor device, and more particularly to a method of manufacturing a semiconductor device which comprises a capacitor.

2. Description of the Related Art

Since semiconductor devices, such as DRAMs (Dynamic Random Access Memory), has been in a trend of high integration, also a capacitor structure has been formed into a 3D form and having a large thickness in order to realize a sufficiently large capacitance within a limited space.

FIGS. 10(a)–10(d) are cross sectional views sequentially showing an essential portion of steps of a method of manufacturing a conventional semiconductor device having a stacked type capacitor.

Figure 10A:
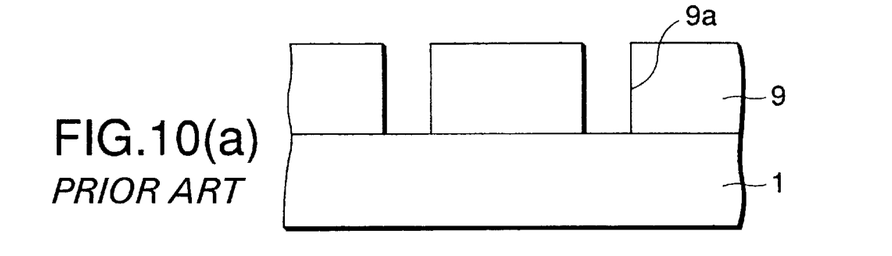
FIGS. 10(a)–10(d) are cross sectional views sequentially showing the processes of a conventional method of manufacturing a semiconductor device.

As shown in FIG. 10(a), an interlayer insulating film 9 in the form of a silicon oxide film is deposited on the overall surface of a silicon substrate 1.

Then, a usual photolithography technique and a usual reactive type ion etching technique are used to form, on the interlayer insulating film 9, a contact hole 9a which reaches the substrate 1.

Figure 10B:
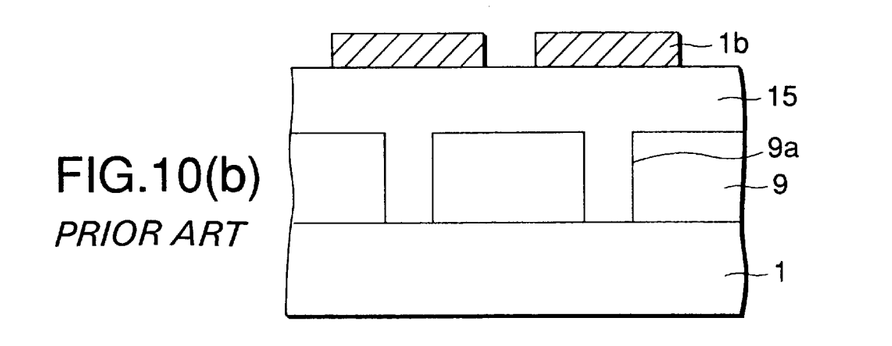

Then, as shown in FIG. 10(b), polysilicon 15 is deposited on the interlayer insulating film 9 including the inside portion of the contact hole 9a.

After the polysilicon has been deposited, a resist is applied to the overall surface.

Then, a photomask different from that used when the contact hole 9a has been formed is used to perform a photolithography process so as to form the resist into a required shape. Thus, a mask 16 is formed.

Figure 10C:
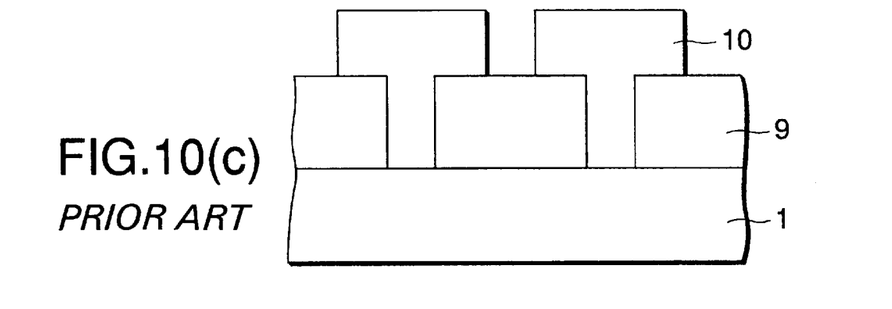

Then, as shown in FIG. 10(c), a dry etching process is performed by using the resist mask 16 to form the polysilicon 15. Thus, a storage node (a lower electrode) 10 is formed.

Figure 10D:
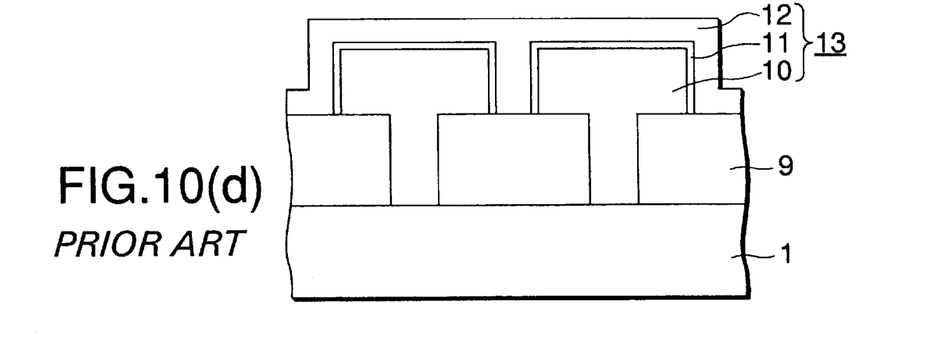

Then, as shown in FIG. 10(d), a dielectric film 11 is formed on the surface of the storage node 10 by, for example, a CVD method. Then, for example, the CVD method is used to grow a polycrystal silicon film. Thus, a cell plate (an upper electrode) 12 is formed so that a stacked type capacitor 13 is formed. As a result, a method of manufacturing a semiconductor device is obtained.

However, the conventional method having the step of forming the contact hole 9a and the storage node 10 by using the individual mask patterns has a difficulty in stacking the contact hole 9a and the storage node 10 with a required accuracy because the structure has been fined considerably.

Since the capacitor 13 has the structure having a large thickness, a process in the direction of the depth cannot easily be performed.

SUMMARY OF THE INVENTION

In view of the foregoing, an object of the present invention is to obtain a semiconductor device capable of eliminating a necessity of performing stacking, thus preventing an error occurring in the stacking process and therefore fining the capacitor thereof.

A method of manufacturing a semiconductor device of the present invention comprises the steps of: forming an interlayer insulating film on a silicon substrate; forming a contact hole in the interlayer insulating film so as to be in contact with the surface of the silicon substrate; filling the contact hole up by forming single crystal silicon; forming an amorphous silicon layer in the contact hole, in which the single crystal silicon has been embedded, and on the interlayer insulating film; growing a single crystal silicon by subjecting the amorphous silicon layer to heat treatment to form the amorphous silicon layer into single crystal silicon selectively by performing solid-phase epitaxial growth which uses the single crystal silicon as a seed; and forming an electrode made of the single crystal silicon by selectively removing a portion of said amorphous silicon layer except for a single-crystalized portion of the amorphous silicon.

The method of manufacturing a semiconductor device is characterized in that the step of filling the contact hole comprises a step of selectively depositing single crystal silicon on the surface of the silicon substrate exposed to the bottom surface of the contact hole as a seed by the method of vapor epitaxial growth.

The method of manufacturing a semiconductor device is characterized in that the step of filling the contact hole comprises a step of growing single crystal silicon by forming the amorphous silicon layer into single crystal silicon by performing solid-phase epitaxial growth from the surface of the silicon substrate exposed to the bottom surface of the contact hole as a seed by subjecting the amorphous silicon layer to heat treatment.

A method of manufacturing a semiconductor device of the present invention comprises the steps of: forming a interlayer insulating film on a silicon substrate; forming a contact hole in the interlayer insulating film so as to be in contact with the surface of the silicon substrate; forming an amorphous silicon layer in the inside portion of the contact hole including the surface of the silicon substrate exposed to the bottom surface of the contact hole and on the interlayer insulating film; growing single crystal silicon by forming the amorphous silicon layer into single crystal silicon selectively by performing solid-phase epitaxial growth from the surface of the silicon substrate exposed to the bottom surface of the contact hole as a seed by subjecting the amorphous silicon layer to heat treatment; and forming an electrode made of the single crystal silicon by removing a portion of the amorphous silicon layer except for a single-crystalized portion of the amorphous silicon.

The method of manufacturing a semiconductor device is characterized in that the step of forming an electrode comprised a step of selectively removing the non-crystalized amorphous silicon by dry etching.

The method of manufacturing a semiconductor device is characterized in that the step of forming an amorphous silicon layer comprises a chemical vapor deposition step using an impurity containing gas.

The method of manufacturing a semiconductor device is characterized in that the step of forming a contact hole comprising a photolithography process using a mask for photolithography, in the interlayer insulating film, and the step of growing the single crystal silicon comprises a step of forming an ion implantation preventing film on the amorphous silicon layer, a step of forming the ion implantation preventing film by using the photolithography technique using a mask for photolithography into a required pattern and a step of implanting an impurity into the amorphous silicon layer by using the ion implantation preventing film formed into the required shape as a mask.

The method of manufacturing a semiconductor device is characterized in that the impurity is one of arsenic and boron.

The method of manufacturing a semiconductor device is characterized in that the step of growing the single crystal silicon by crystalizing the amorphous silicon layer into the single crystal silicon is performed such that the single crystal silicon is grown up not only inside the contact hole but on the interlayer insulating film.

The method of manufacturing a semiconductor device is characterized in that the method further comprises a step of forming a dielectric film on the surface of the electrode and a step of forming another electrode facing to the electrode across the dielectric film.

DESCRIPTION OF THE PREFFERD EMBODIMENT

First Embodiment

A first embodiment of the present invention will now be described with reference to FIGS. 1 to 3.

Figure 1:
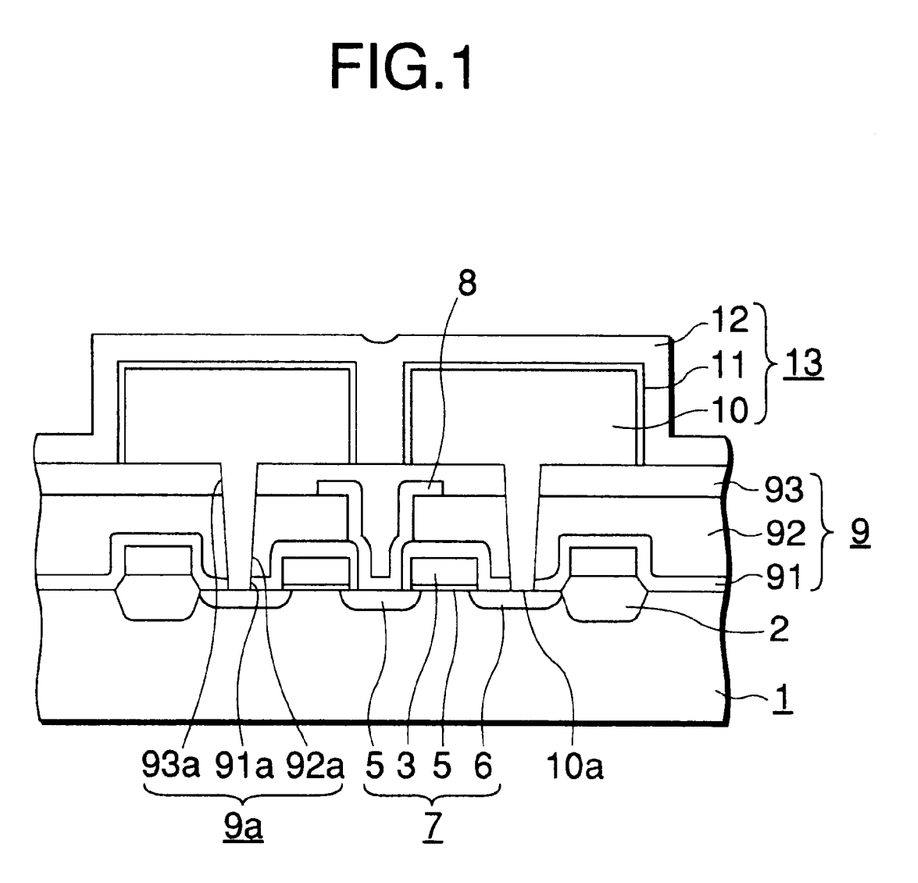
FIG. 1 is a cross sectional view showing an essential portion of a semiconductor device according to a first embodiment of the present invention.

FIG. 1 is a cross sectional view showing an essential portion of the structure of a semiconductor device according to a first embodiment of the present invention. Referring to FIG. 1, reference numeral 1 represents, for example, a P-type silicon substrate, 2 represents a device insulating film formed on the main surface of the silicon substrate 1 by using, for example, a LOCOS (Local Oxidation of Silicon) method.

Reference numeral 3 represents a gate electrode formed on the silicon substrate 1 through a gate insulating film 4 and serving as a portion of a word line. Reference numerals 5 and 6 represent, for example, N-type source and drain regions formed on the main surface of the silicon substrate 1 at opposite positions across the word line 3 at positions below the gate electrode 3.

Reference numeral 7 represents an N-channel MOS field effect transistor formed on the main surface of the silicon substrate 1 and having the gate electrode 3, the gate insulating film 4 and the source and drain regions 5 and 6. Reference numeral 8 represents a bit line electrically in contact with the source region 5.

Reference numeral 9 represents an interlayer insulating film having a contact hole 9a in contact with the surface of the drain region 6, formed on the silicon substrate 1 and having a thickness of about 0.5 $\mu$m. The interlayer insulating film 9 has a first interlayer insulating film 91 formed on the upper and side surfaces of the word line 3 and in the form of, for example, a silicon nitride film, a second interlayer insulating film 92 deposited on the first interlayer insulating film, having a bit line 8 formed thereon and in the form of, for example, a silicon nitride film and a third interlayer insulating film 93 formed on the bit line 8.

The contact hole 9a is composed of a portion 91a of the contact hole formed in the first interlayer insulating film 91, a portion 92a of the contact hole formed in the second interlayer insulating film 92 and a portion 93a of the contact hole formed in the third interlayer insulating film 93.

Reference numeral 10 represents a storage node extending from a storage node contact 10a formed on the surface of the silicon substrate 1 to reach the third interlayer insulating film 93 through the contact hole 9a and made of single crystal epitaxial silicon. The thickness of the storage node 10 realized on the third interlayer insulating film 93 is about 0.5 $\mu$m. Reference numeral 11 represents a dielectric film formed on the surface of the storage node 10. At a position opposite to the storage node 10 across the dielectric film 11, a cell plate 12 is formed. Reference numeral 13 represents a capacitor having the storage node (a lower electrode) 10, the dielectric film 11 and the cell plate (an upper electrode) 12.

A method of manufacturing the semiconductor device having the above-mentioned structure will now be described with reference to FIGS. 2(a)–3(d) which are cross sectional views sequentially showing the processes of the method of manufacturing the semiconductor device.

Figure 2A:
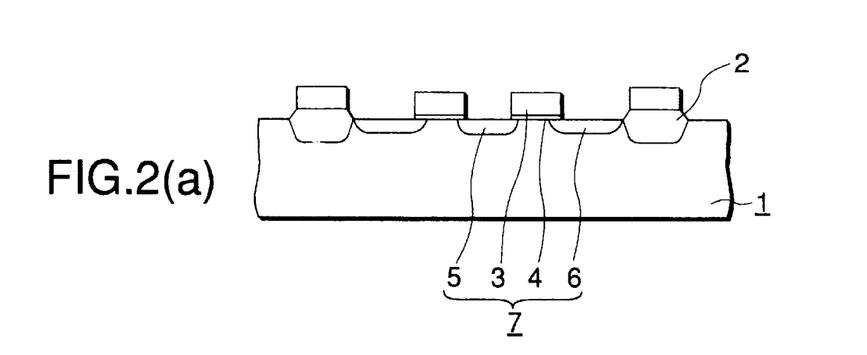
FIGS. 2(a)–2(c) are cross sectional views sequentially showing an essential portion of the processes of a method of manufacturing a semiconductor device according to the first embodiment.

As shown in FIG. 2(a), the device insulating film 2 is formed at a required position on the main surface of the P-type silicon substrate 1 by using, for example, a LOCOS method. Then, the gate insulating film 4 in the form of a silicon oxide film having a thickness of about 0.01 $\mu$m is formed on the surface of the silicon substrate 1 by, for example, a heat oxidation method. For example, a polycrystal silicon film and a tungsten silicide film are, in this sequential order, deposited on the gate insulating film 4 by a chemical vapor deposition (CVD) method, and then a usual photolithography technique is used to obtain a required shape by patterning. Thus, the word line (the gate electrode) 3 is formed.

Then, the word line 3 and the device insulating film 2 are used as masks to implant, for example, arsenic of boron so that the N-type source region 5 and drain region 6 are formed on the main surface of the silicon substrate 1. Thus, the N-channel MOS field effect transistor 7 is formed.

Figure 2B:
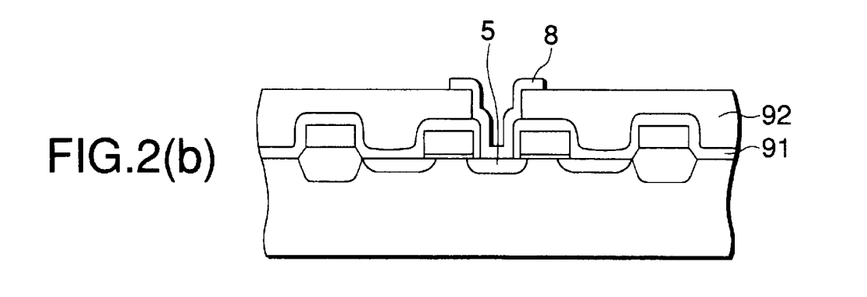

Then, as shown in FIG. 2(b), the first interlayer insulating film 91 in the form of, for example, a nitride silicon film, is deposited on the overall surface of the silicon substrate 1 by using the CVD method. On the first interlayer insulating film 91, the second interlayer insulating film 92 in the form of a TEOS (Tetra-Ethyl-Ortho Silicate) oxide film is formed by using, for example, the CVD method. Then, the known photolithography technique and the anisotropic etching technique are used so that the contact hole in contact with the surface of the source region 5 is formed in the first interlayer insulating films 91 and 92.

Then, for example, a polycrystal silicon film to serve as the bit line 8 and the tungsten silicide film for reducing the resistance are, in this sequential order, deposited on the silicon substrate 1 including the contact hole by using the CVD method. Thus, the bit line 8 is formed.

Figure 2C:
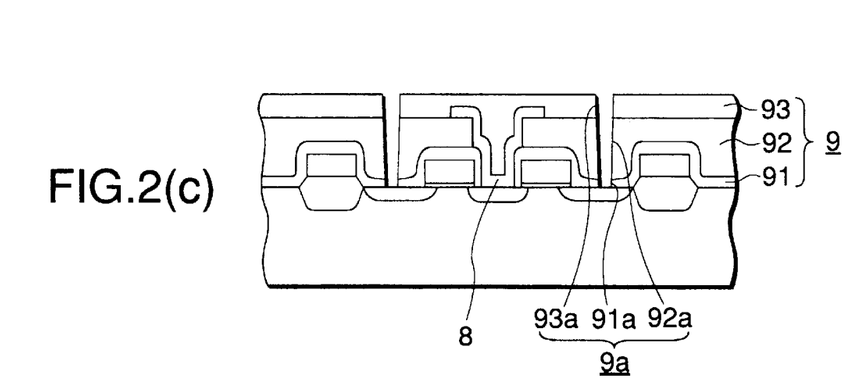

Then, as shown in FIG. 2(c), the third interlayer insulating film 93 in the form of a TEOS oxide film is deposited on the overall surface of the silicon substrate 1 by using, for example, the CVD method. Total thickness of the first, second and third insulating layer is about 0.5 $\mu$m.

Then, the photolithography technique using a specific mask for the photolithography and the known reactive ion etching technique are used to selectively etch the interlayer insulating films 93, 92 and 91 so that the contact hole 9a consisting of the contact holes 91a, 92a and 93a which reach the drain region 6 is formed.

Figure 3A:
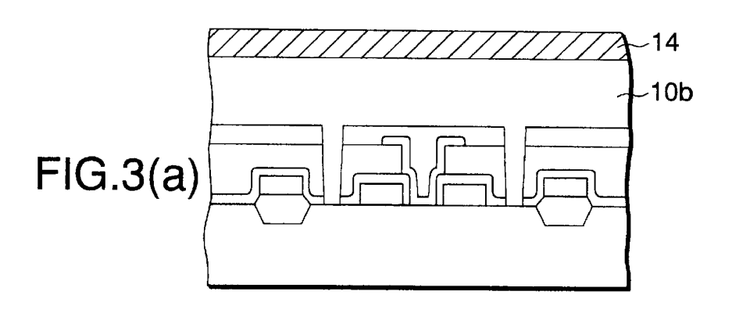
FIGS. 3(a)–3(d) are cross sectional views sequentially showing an essential portion of the processes of the method of manufacturing the semiconductor device according to the first embodiment.

Then, as shown in FIG. 3(a), the amorphous silicon 10b is deposited on the interlayer insulating film 9 including the inside portion of the contact hole 9a. The forming process is performed under the conditions that a tube-type low pressure CVD apparatus is used, the temperature at which the process is performed is about 530° C. and the depositing pressure is about 0.2 Torr. The temperature at which the process is performed may be in a range from 450° C. to 570° C.

After the amorphous silicon 10b has been deposited, a resist 14 is applied to the overall surface.

Figure 3B:
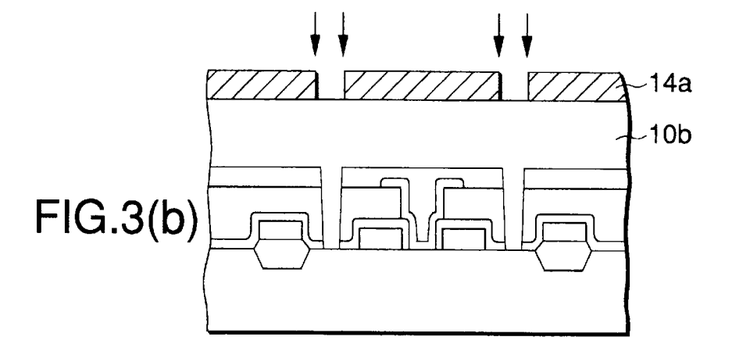

Then, as shown in FIG. 3(b), the mask for photolithography used when the contact hole 9a has been formed is used to perform a photolithography process so that the resist 14 is formed to have a required shape. Then, implantation of phosphorus ions is performed such that the resist 14 is used as a mask 14a for preventing implantation of ions. The implantation is performed under the conditions that the implanting energy is 50 keV and the dose is $4\times10^{15}/cm^2$. The thickness of the resist 14 at this time is determined in such a manner that implantation of ions into the amorphous silicon 10b can be prevented under the above-mentioned ion implanting conditions.

Figure 3C:
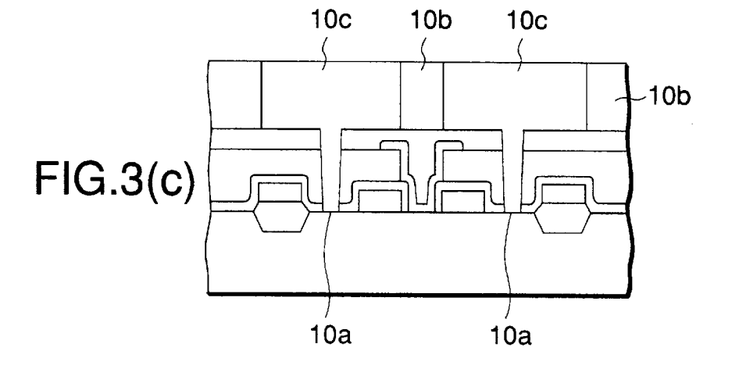

Then, as shown in FIG. 3(c), the amorphous silicon 10b is subjected to heat treatment. As a result of the heat treatment, solid phase epitaxial growth of the contact region (the storage node contact) 10a with the silicon substrate is performed so that the amorphous silicon 10b is partially formed into single crystal. Thus, single crystal silicon 10c is grown. The heat treatment condition at this time is determined such that the treatment is performed at 900° C. for three hours. Since the impurity, such as phosphorus, is locally implanted into the amorphous silicon 10b, the growing rate of the solid-phase epitaxial growth of the portion, into which ions have been implanted, can selectively be raised.

Figure 3D:
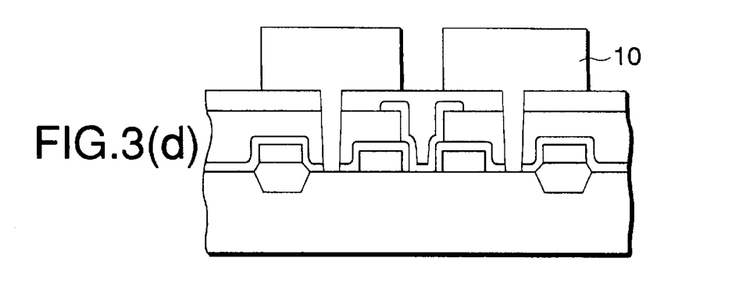

Then, as shown in FIG. 3(d), the difference in the etching rate between the amorphous silicon 10b and the single crystal silicon 10c is used to leave the region 10c formed into single crystal when the usual dry etching technique is employed to selectively remove the amorphous silicon 10b. Thus, the storage node 10 is formed.

Then, for example, the CVD method is employed to form the dielectric film 11 on the surface of the storage node 10.

Then, for example, the CVD method is employed to grow the polycrystal silicon film so that the cell plate 12 is formed. Thus, a stacked type capacitor 13 is formed. As a result, the semiconductor device shown in FIG. 1 is obtained.

Since the first embodiment of the present invention has the above-mentioned structure, the positions of the ends of the storage node 10 on the interlayer insulating film 9 can be made to be symmetrical with respect to the contact hole 9a.

Since the necessity of forming the mask for use in etching for determining the positions of the ends of the storage node 10 on the interlayer insulating film 9 can be eliminated, the number of manufacturing processes can be reduced as compared with the conventional method of forming the storage node 10.

Since the storage node 10 is formed by using the single crystal silicon grown from the substrate 1 through the contact hole 9a, any error occurring when stacking is performed to carry out the photolithography for forming the mask can be prevented as a consequence. Therefore, the capacitor 13 can be formed precisely.

Since the first embodiment enables the storage node 10 in the form of single crystal silicon to be formed by epitaxial growth from the silicon substrate 1, the bearing of crystal in the silicon substrate 1 and that in the storage node 10 in the storage node contact 10a can be made to be the same. Therefore, the contact resistance in the storage node contact 10a can be weakened.

Since the storage node 10 is made of the single crystal silicon in the first embodiment, the surface of the storage node 10 formed opposite to the cell plate 12 across the dielectric film 11 can be flattened as compared with the method in which the polycrystal silicon is used. Therefore, concentration of electric fields into the surface of the storage node 10 in the capacitor 13 can be prevented. As a result, an effect can be obtained in that the reliability of the semiconductor device can be improved.

Although the first embodiment has the step of implanting phosphorus for selectively raising the growing rate of the solid-phase epitaxial growth in the portion into which ions have been implanted, arsenic or boron may be implanted. Also in this case, an effect similar to that obtainable from the above-mentioned method can be obtained. When phosphorus or arsenic is employed, generation of polycrystal cores can be prevented. Therefore, the shape and size of the storage node 10 can easily be controlled.

Since ions are, in the first embodiment, partially implanted by using the mask for photolithography for forming the contact hole, the epitaxial growth can selectively be realized in the portion of the amorphous silicon 10b into which the impurity has been implanted. Therefore, the size and shape of the storage node 10 can easily be controlled. Moreover, an effect can be obtained in that the reproducibility of the size and shape of the storage node 10 can easily be maintained.

Since the impurity is contained in the amorphous silicon 10b in this embodiment, the margin permitted for the heat treatment conditions for the epitaxial growth can be enlarged.

Second Embodiment

A method of manufacturing a semiconductor device according to a second embodiment of the present invention will now be described with reference to FIGS. 4(a)–5(c) which are cross sectional views sequentially showing an essential portion of the process of the method of manufacturing a semiconductor device.

Figure 4A:
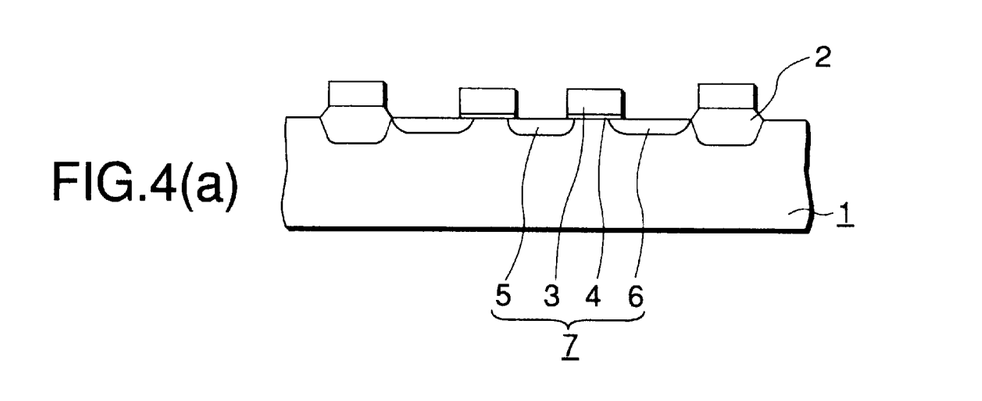
FIGS. 4(a)–4(c) are cross sectional views sequentially showing an essential portion of the processes of the method of manufacturing the semiconductor device according to a second embodiment.

Initially, as shown in FIG. 4(a), a device insulating film 2 is formed at a required position on the main surface of a P-type silicon substrate 1 by using, for example, a LOCOS method. Then, a gate insulating film 4 in the form of a silicon oxide film having a thickness of about 0.01 μm is formed on the surface of the silicon substrate 1 by, for example, a heat oxidation method. For example, a polycrystal silicon film and a tungsten silicide film are, in this sequential order, deposited on the gate insulating film 4 by a CVD method, and then a usual photolithography technique is used to obtain a required shape by patterning. Thus, a word line (a gate electrode) 3 is formed.

Then, the word line 3 and the device insulating film 2 are used as masks and implantation of, for example, phosphorus or arsenic ions is performed so that an N-type source region 5 and drain region 6 are formed on the main surface of the silicon substrate 1. Thus, an N-channel MOS field effect transistor 7 is formed.

Figure 4B:
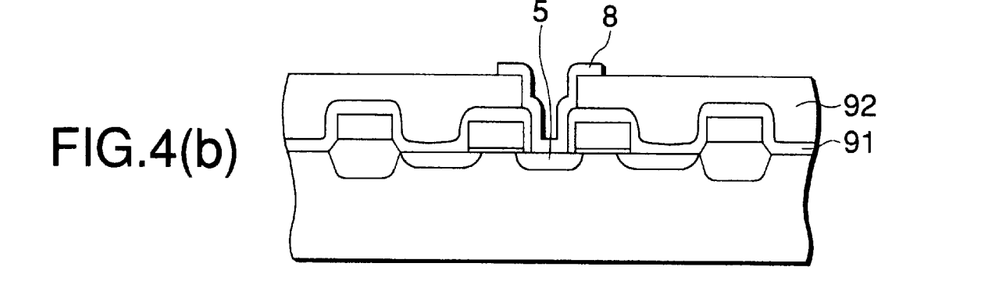

Then, as shown in FIG. 4(b), a first interlayer insulating film 91 in the form of, for example, a nitride silicon film, is formed on the overall surface of the silicon substrate 1 by using the CVD method. On the first interlayer insulating film 91, for example, the CVD method is employed so that a second interlayer insulating film 92 in the form of a TEOS oxide film is formed. Then, the usual photolithography technique and anisotropic etching technique are used so that a contact hole in contact with the surface of the source region 5 is formed in the first interlayer insulating films 91 and 92.

Then, a polycrystal silicon film which will be formed into a bit line 8 and a tungsten silicide film for lowering the resistance are, in this sequential order, deposited on the silicon substrate 1 including the contact hole by using the CVD method. Then, the usual photolithography technique is employed to form a required shape by patterning so that the bit line 8 is formed.

Figure 4C:
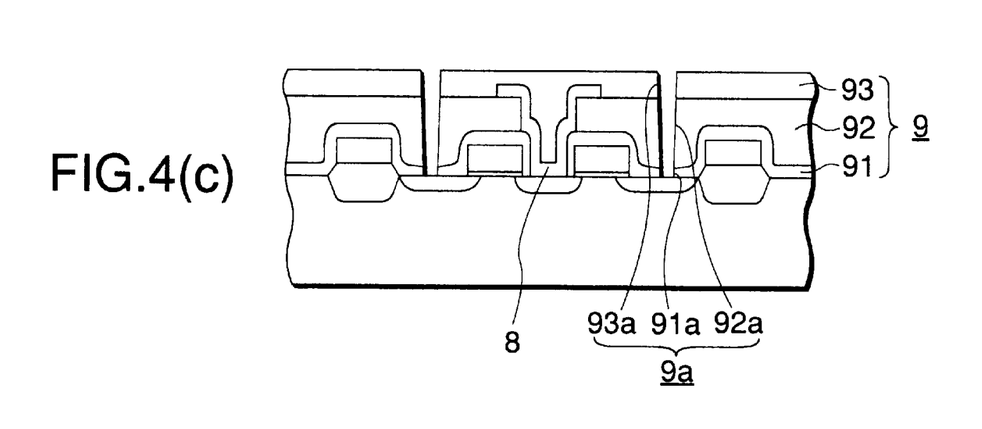

Then, as shown in FIG. 4(c), a third interlayer insulating film 93 in the form of a TEOS oxide film is deposited on the overall surface of the silicon substrate 1 by using, for example, the CVD method.

Then, the usual photolithography technique and the usual reactive ions etching technique are employed so that the interlayer insulating films 93, 92 and 91 are selectively etched so that a contact hole 9a composed of contact holes 91a, 82a and 93a which reach the drain region 6 is formed.

Figure 5A:
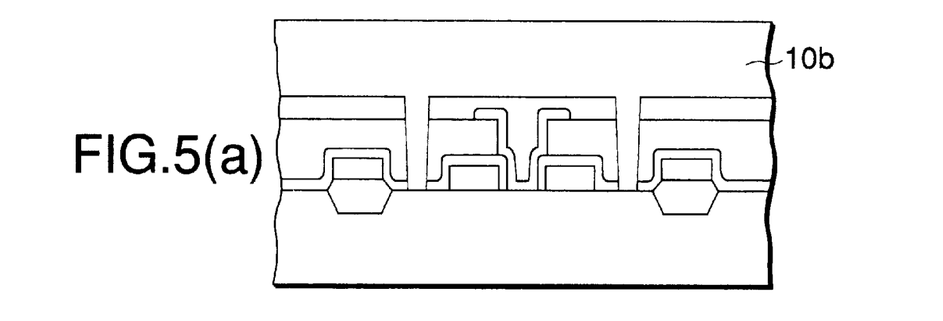
FIGS. 5(a)–5(c) are cross sectional views sequentially showing an essential portion of the processes of the method of manufacturing the semiconductor device according to the second embodiment.

Then, as shown in FIG. 5(a), an amorphous silicon 10b is deposited on the interlayer insulating film 9 including the inside portion of the contact hole 9a. At this time, the conditions for the film forming process are such that a tube type low-pressure CVD apparatus is used, the temperature at which the process is performed is about 530° C. and the depositing pressure is about 0.2 Torr. The temperature at which growing is performed may be in a range from 450° C. to 570° C.

Figure 5B:
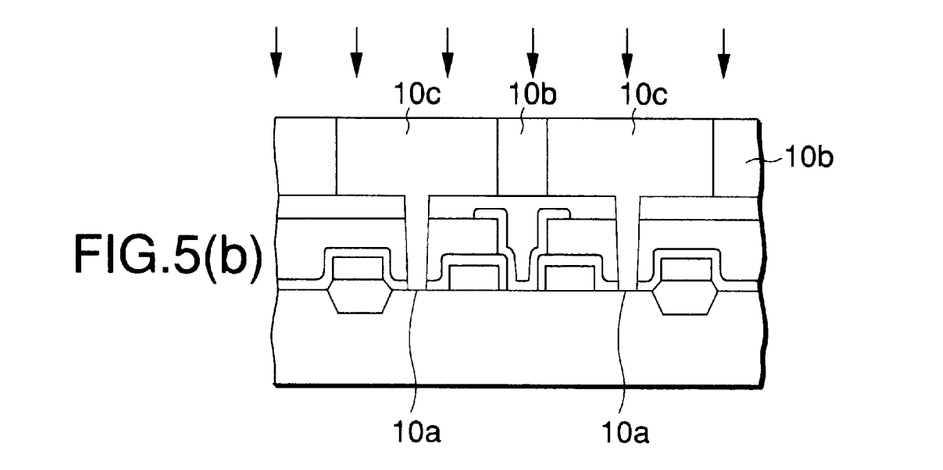

Then, as shown in FIG. 5(b), the amorphous silicon 10b is subjected to heat treatment. As a result of the heat treatment, solid-phase epitaxial growth from the contact region (storage node contact) 10a is performed so that the amorphous silicon 10b is partially formed into single crystal. Thus, the single crystal silicon 10c is grown. At this time, conditions under which the heat treatment is performed are such that the temperature is, for example, 900° C. and the time period is four hours. When heat treatment, for example, laser annealing is performed to grow the single crystal silicon, an effective result can be obtained.

Then, phosphorus ions are implanted into the overall surface of the single crystal silicon 10c and the amorphous silicon 10b. At this time, the conditions under which implantation is performed are such that the injecting energy is 50 keV and the dose is $4 \times 10^{15}/cm^2$ to $8 \times 10^{15}/cm^2$. The ion implantation process is performed to make the non-doped single crystal silicon 10c to be conductive.

Figure 5C:
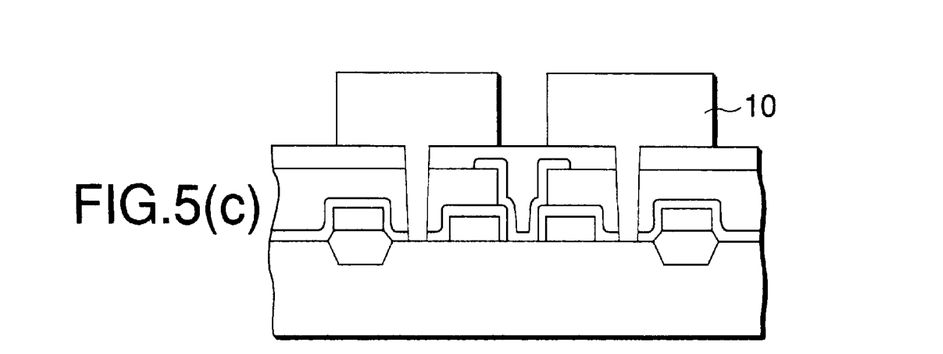

Then, as shown in FIG. 5(c), the difference in the etching rate between the amorphous silicon 10b and the single crystal silicon 10c is used to selectively remove the amorphous silicon 10b by the usual dry etching technique in such a manner that a region 10c formed into the single crystal is left. Thus, the storage node 10 is formed.

Then, for example, the CVD method is employed to form a dielectric film 11 on the surface of the storage node 10. Then, for example, the CVD method is employed to grow the polycrystal silicon film so that a cell plate 12 is formed and thus a stacked type capacitor 13 is formed. As a result, a semiconductor device having the structure shown in FIG. 1 can be obtained.

Since the second embodiment is arranged as described above, the positions of the ends of the storage node 10 on the interlayer insulating film 9 can be made to be symmetrical with respect to the contact hole 9a.

As compared with the conventional method of forming the storage node 10, the necessity of forming the mask for determining the positions of the ends on the interlayer insulating film 9 can be eliminated. Thus, the number of manufacturing processes can be reduced.

Since the storage node 10 is formed by using the single crystal silicon grown from the silicon substrate 1 through the contact hole 9a, an error occurring when stacking is performed when photolithography is performed for forming the mass can be prevented as a consequence. Therefore, the capacitor 13 can be formed precisely.

Since the second embodiment is able to form the storage node 10 composed of single crystal silicon can be formed attributable to epitaxial growth from the silicon substrate 1, the bearing of crystal in the silicon substrate 1 and that in the storage node 10 in the storage node contact 10a can be made to be the same. Therefore, the contact resistance in the storage node contact 10a can be reduced.

Since the storage node 10 is, in the second embodiment, made of single crystal silicon, the surface of the storage node 10 formed opposite to the cell plate 12 across the dielectric film 11 can be flattened as compared with the made of polycrystal silicon. Therefore, concentration of electric fields into the surface of the storage node 10 in the capacitor 13 can be prevented. Therefore, an effect can be obtained in that the reliability of the semiconductor device can be improved.

Although the second embodiment has the structure such that phosphorus is implanted in order to make the non-doped single crystal silicon 10c to be conductive, arsenic ions may be implanted. Also in this case, an effect similar to that obtainable from the above-mentioned embodiment can be obtained.

Although the second embodiment has the arrangement in which implantation of ions of the impurity is performed after the solid-phase epitaxial growth has been performed, another arrangement may be employed in which ions are implanted after the amorphous silicon 10b has been formed and before the solid-phase epitaxial growth is performed. In this case, the growing rate in the solid-phase epitaxial growth can be raised.

Since the second embodiment is able to eliminate the necessity of forming the mask 14a for preventing implantation of ions as compared with the above-mentioned first embodiment, the number of manufacturing processes can be reduced.

Third Embodiment

A method of manufacturing a semiconductor device according to a third embodiment of the present invention will now be described with reference to FIGS. 6(a)–7(c) which are cross sectional views sequentially showing the steps of the method of manufacturing a semiconductor device.

Figure 6A:
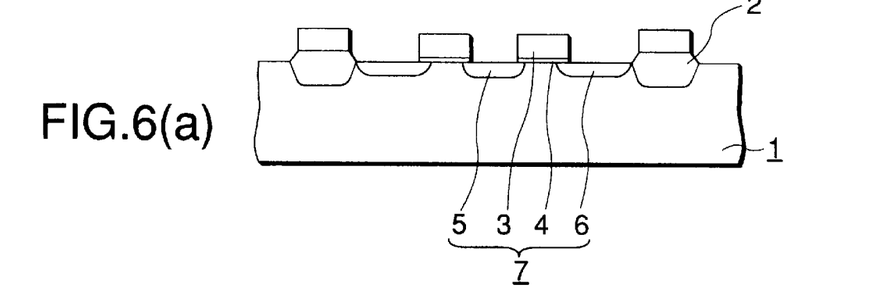
FIGS. 6(a)–6(c) are cross sectional views sequentially showing an essential portion of the processes of the method of manufacturing the semiconductor device according to a third embodiment.

As shown in FIG. 6(a), a device insulating film 2 is formed at a required position on the main surface of the P-type silicon substrate 1 by using, for example, the LOCOS method. Then, a gate insulating film 4 having a thickness of about 0.01 μm and in the form of a silicon oxide film is formed on the surface of the silicon substrate 1 by using, for example, the heat oxidation method. On the gate insulating film 4, a polycrystal silicon film and a tungsten silicide film which will be formed into a gate electrode 3 are deposited in this sequential order by using the CVD method. Then, the usual photolithography technique and the anisotropic etching technique are employed to obtain a required shape by patterning so that the word line (the gate electrode) 3 is formed.

The word line 3 and the device insulating film 2 are used as masks when implantation of, for example, phosphorus or arsenic is performed so that an N-type source region 5 and drain region 6 are formed on the main surface of the silicon substrate 1. As a result, an N-channel MOS field effect transistor 7 is formed.

Figure 6B:
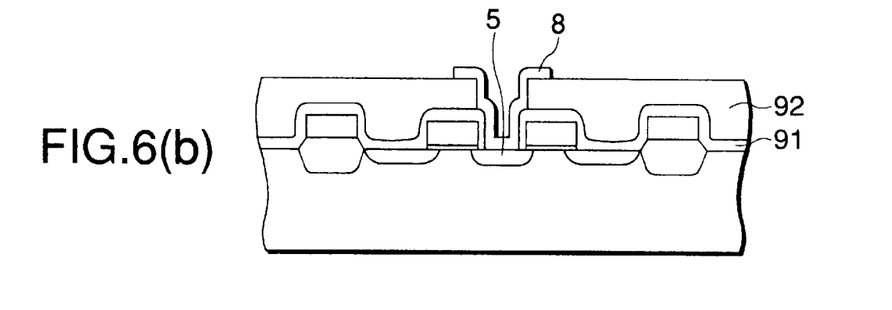

As shown in FIG. 6(b), a first interlayer insulating film 91 in the form of, for example, nitride silicon film is deposited on the overall surface of the silicon substrate 1 by using the CVD method. On the first interlayer insulating film 91, a second interlayer insulating film 92 in the form of a TEOS oxide film is formed by using, for example, the CVD method. Then, the usual photolithography technique and the anisotropic etching technique are employed so that a contact hole in contact with the surface of the source region 5 is formed in the first interlayer insulating films 91 and 92.

Then, a polycrystal silicon film which will be formed into a bit line 8 and a tungsten silicide film for lowering the resistance are, in this sequential order, deposited on the silicon substrate 1 including the contact hole. Then, the usual photolithography technique is employed to obtain a required shape by patterning. Thus, the bit line 8 is formed.

Figure 6C:
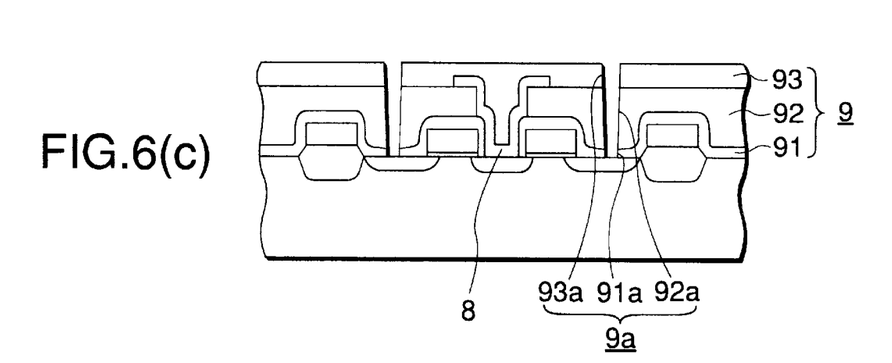

Then, as shown in FIG. 6(c), a third interlayer insulating film 93 in the form of a TEOS oxide film is deposited on the overall surface of the silicon substrate 1 by using, for example, the CVD method.

Then, the usual photolithography technique and the usual reactive ions etching technique are employed to selectively etch the third interlayer insulating films 93, 92 and 91. As a result, a contact hole 9a composed of contact holes 91a, 92a and 93a which reach the drain region 6 is formed.

Figure 7A:
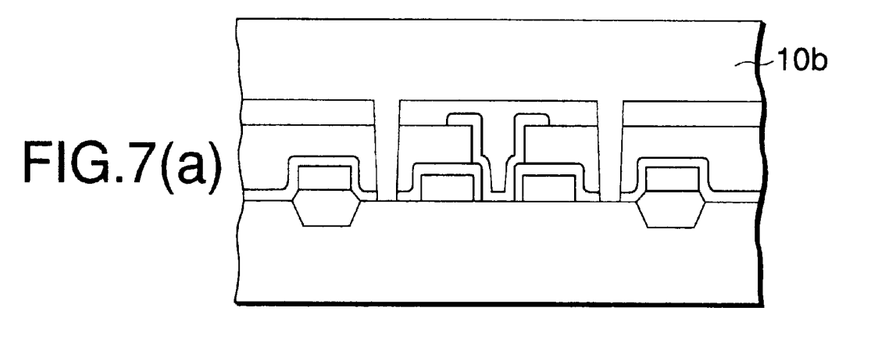
FIGS. 7(a)–7(c) are cross sectional views sequentially showing an essential portion of the processes of the method of manufacturing the semiconductor device according to the third embodiment.

Then, as shown in FIG. 7(a), amorphous silicon 10b is deposited on the interlayer insulating film 9 including the inside portion of the contact hole 9a. When the amorphous silicon film is deposited, phosphorus was, as an impurity, added simultaneously in the form of, for example, phosphine ($PH_3$) gas. At this time, an apparatus used to form the film was a tube type low pressure CVD apparatus. The temperature at which the film was formed was 520° C., the depositing pressure was 0.2 Torr and the concentration of phosphorus was $6 \times 10^{20}/cm^3$. The concentration of phosphorus may be in a range from $4 \times 10^{20}/cm^3$ to $8 \times 10^{20}/cm^3$. The growing temperature may be in a range from 450° C. to 570° C.

Figure 7B:
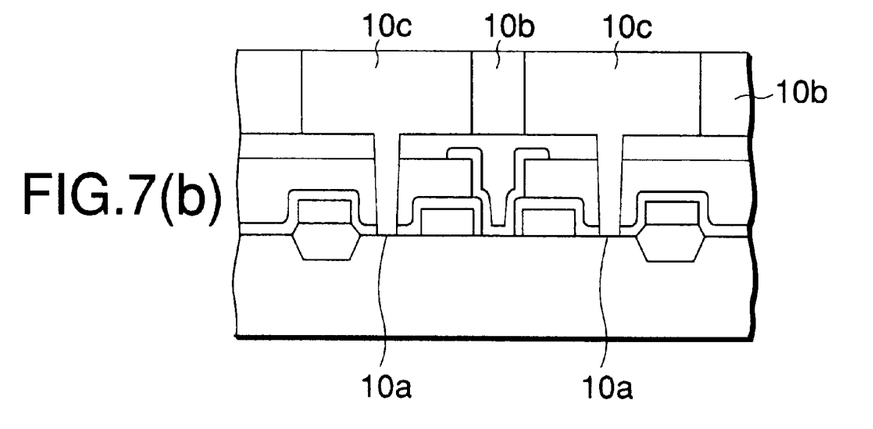

Then, as shown in FIG. 7(b), the amorphous silicon 10b is subjected to heat treatment. As a result of the heat treatment, solid-phase epitaxial growth is allowed to take place from the contact region (storage node contact) 10a with the silicon substrate so that the amorphous silicon 10b is partially formed into single crystal. Thus, single crystal silicon 10c is grown. At this time, the heat treatment conditions were determined such that the temperature was 900° C. and the period of time was three hours. Since the impurity, such as phosphorus, is added to the amorphous silicon 10b, the growing rate in the solid-phase epitaxial growth can be raised. It is effective to perform the growth by using heat treatment, such as laser annealing.

Figure 7C:
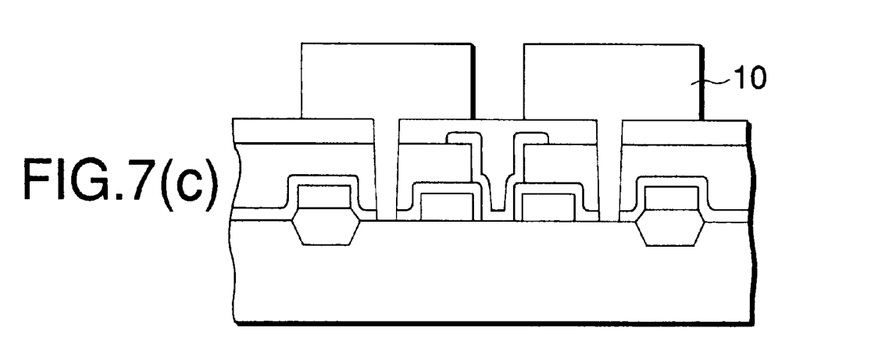

Then, as shown in FIG. 7(c), the difference in the etching rate between the amorphous silicon 10b and the single crystal silicon 10c is used to perform the usual dry etching technique to selectively remove the amorphous silicon 10b in such a manner that a region 10c formed into single crystal is left. Thus, a storage node 10 is formed.

Then, for example, the CVD method is employed to form a dielectric film 11 on the surface of the storage node 10. Then, for example, the CVD method is employed to grow the polycrystal silicon film so that a cell plate 12 is formed and thus a stacked type capacitor 13 is formed. As a result, the semiconductor device shown in FIG. 1 is obtained.

Since the semiconductor device is, in the third embodiment, formed as described above, the positions of the ends of the storage node 10 on the interlayer insulating film 9 can be made to be symmetrical with respect to the contact hole 9a.

Since the necessity of forming the mask for determining the positions of the ends of the storage node 10 on the interlayer insulating film 9 can be eliminated as compared with the conventional method of forming the storage node 10, the number of manufacturing processes can be reduced.

Since the storage node 10 is formed by using the single crystal silicon grown from the silicon substrate 1 through the contact hole 9a, an error in the stacking occurring when the photolithography process is performed to form the mask can be prevented as a consequence. Therefore, the capacitor 13 can be formed precisely.

Since the third embodiment is able to form the storage node 10 made of single crystal silicon attributable to the epitaxial growth from the silicon substrate 1, the bearing of the crystal in the silicon substrate 1 and that the storage node 10 can be made to be the same in the storage node contact 10a. Therefore, the contact resistance in the storage node contact 10a can be reduced.

Since the third embodiment is arranged in such a manner that the storage node 10 is made of single crystal silicon, the surface of the formed opposite to the cell plate 12 across the dielectric film 11 can be flattened as compared with the conventional method using polycrystal silicon. Therefore, concentration of electric fields into the surface of the storage node 10 can be prevented. Thus, an effect can be obtained in that the reliability of the semiconductor device can be improved.

Since the necessity of forming the mask 14a for preventing implantation of ions can be eliminated, the number of manufacturing processes can be reduced as compared with the first embodiment.

Since the third embodiment is free from a necessity of implanting ions, such as phosphorus, an effect can be obtained in that the number of manufacturing processes can furthermore be reduced as compared with the second embodiment.

Since phosphorus is added as the impurity when the amorphous silicon is deposited in order to raise the growing rate in the solid-phase epitaxial growth, arsenic in the form of arsine (AsH$_3$) gas or boron in the form of diborane (B$_2$H$_6$) may be added in place of phosphorus. Also in this case, an effect similar to that obtainable from the above-mentioned case may be obtained.

When phosphorus or arsenic is added, generation of polycrystal silicon film core can be prevented. Therefore, polycrystallization of amorphous silicon 10b formed on the third interlayer insulating film 93 can be prevented. Thus, another effect can be obtained in that the shape and size of the storage node 10 can easily be controlled.

Fourth Embodiment

A method of manufacturing a semiconductor device according to a fourth embodiment of the present invention will now be described with reference to FIGS. 8(a)–9(d) which are cross sectional views sequentially showing essential portion of the processes of the method of manufacturing a semiconductor device.

Figure 8A:
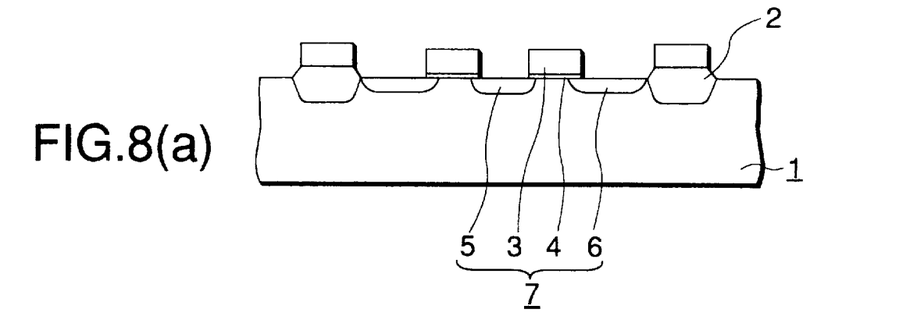
FIGS. 8(a)–8(c) are cross sectional views sequentially showing an essential portion of the processes of the method of manufacturing the semiconductor device according to a fourth embodiment.

As shown in FIG. 8(a), a device insulating film 2 is formed at a required position on the main surface of, for example, P-type silicon substrate 1 by using, for example, a LOCOS method. Then, a gate insulating film 4 having a thickness of about 0.01 μm and in the form of silicon oxide film is formed on the surface of the silicon substrate 1 by, for example, a heat oxidation method. On the gate insulating film 4, a polycrystal silicon film and a tungsten silicide film which will be formed into a gate electrode 3 are, in this sequential order, deposited by using the CVD method. Then, the usual photolithography technique and the anisotropic etching technique are used to form a required shape by patterning. Thus, the word line (the gate electrode) 3 is formed.

Then, the gate electrode 3 and the device insulating film 2 are used as masks when phosphorus or arsenic ions are implanted so that an N-type source region 5 and a drain region 6 are formed on the main surface of the silicon substrate 1. Thus, an N-channel MOS field effect transistor 7 is formed.

Figure 8B:
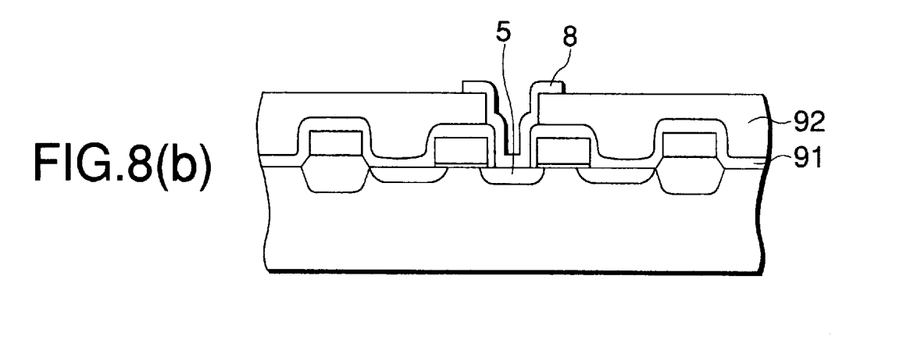

Then, as shown in FIG. 8(b), a first interlayer insulating film 91 in the form of, for example, nitride silicon film, is deposited on the overall surface of the silicon substrate 1. On the first interlayer insulating film 91, for example, the CVD method is employed so that a second interlayer insulating film 92 in the form of a TEOS oxide film is formed. Then, the usual photolithography technique and anisotropic etching technique are employed to form a contact hole in contact with the surface of the source region 5 in the first interlayer insulating films 91 and 92.

Then, polycrystal silicon film which will be formed into a bit line 8 and a tungsten silicide film for lowering the resistance are, in this sequential order, deposited on the silicon substrate 1 including the contact hole by using the CVD method. Then, the usual photolithography technique is employed to form a required shape by patterning so that the bit line 8 is formed.

Figure 8C:
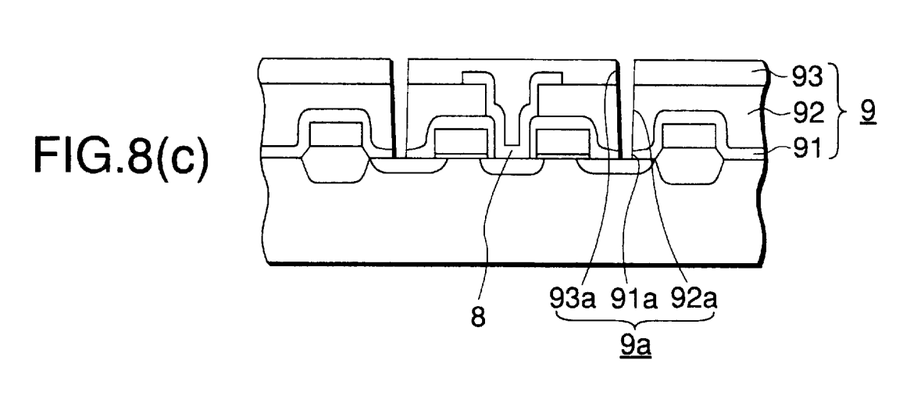

Then, as shown in FIG. 8(c), a third interlayer insulating film 93 in the form of a TEOS oxide film is deposited on the overall surface of the silicon substrate 1 by using, for example, the CVD method.

Then, the usual photolithography technique and the usual reactive ion etching technique are employed to selectively etch the third interlayer insulating films 93, 92 and 91 so that a contact hole 9a composed of contact holes 91a, 92a and 93a which reach the drain region 6 is formed.

Figure 9A:
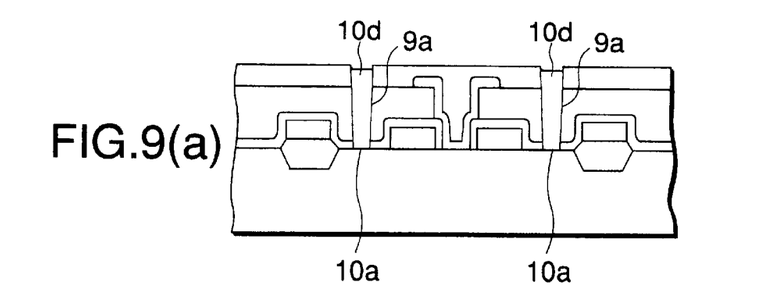
FIGS. 9(a)–9(d) are cross sectional views sequentially showing an essential portion of the processes of the method of manufacturing the semiconductor device according to the fourth embodiment.

Then, as shown in FIG. 9(a), a single crystal silicon 10d is formed in the inside portion of the contact hole 9a by vapor phase epitaxial growth taking place from the contact region (the storage node contact) 10a with the silicon substrate so as to be embedded in the contact hole 9a. Although the tube type low-pressure CVD apparatus is employed in the fourth embodiment, a barrel or single-wafer reactor may be employed. The epitaxial growth of single crystal silicon may be performed under the normal pressure in this case.

Figure 9B:
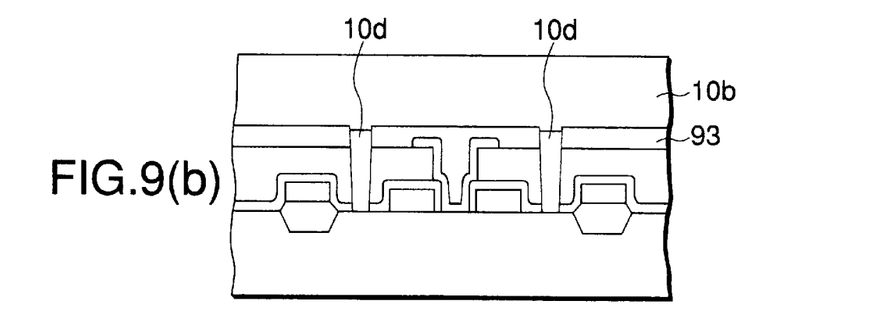

Then, as shown in FIG. 9(b), amorphous silicon 10b is continuously deposited on the single crystal silicon 10d and the interlayer insulating film 9. At this time, the conditions, under which the film is formed are such that, for example, the above-mentioned tube type low-pressure CVD apparatus is employed, the temperature at which the film is formed is about 530° C. and the depositing pressure is about 0.2 Torr. At this time, the temperature at which growth is performed may be in a range from 450° C. to 570° C.

Figure 9C:
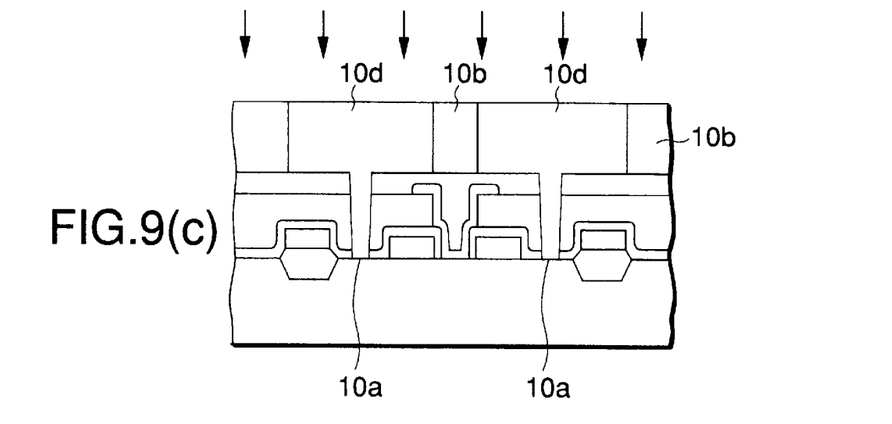

Then, as shown in FIG. 9(c), the amorphous silicon 10b is subjected to heat treatment. As a result of the heat treatment, the single crystal silicon 10d serves as a seed to perform solid-phase epitaxial growth so that the amorphous silicon 10b is partially formed into single crystal. Thus, the single crystal silicon 10d is further grown. At this time, the heat treatment conditions are such that the temperature is 900° C. and the period of time is three hours.

Then, phosphorus ions are implanted into the overall surface of the single crystal silicon 10d and the amorphous silicon 10b. The implanting conditions are such that the implanting energy is 50 keV and the dose is $4 \times 10^{15}$/cm$^2$ to $8 \times 10^{15}$/cm$^2$. The process for implanting ions is performed to make the non-doped single crystal silicon 10d to be conductive.

Figure 9D:
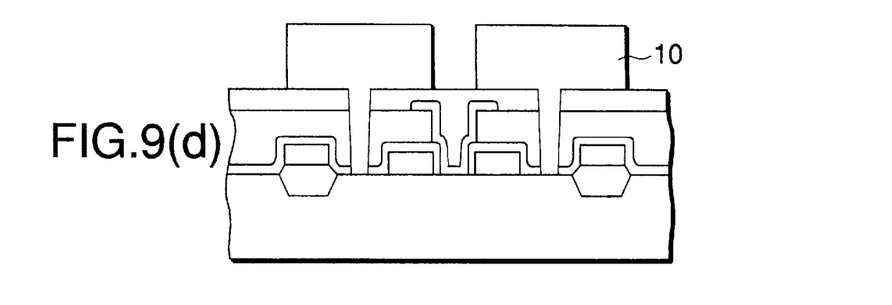

Then, as shown in FIG. 9(d), the difference in the etching rate between the amorphous silicon 10b and the single crystal silicon 10d is used to selectively remove the amorphous silicon 10b by the usual dry etching technique in such a manner that the region 10d is left. Thus, a storage node 10 is formed.

Then, a dielectric film 11 is formed on the surface of the storage node 10 by, for example, the CVD method. Then, the polycrystal silicon film is grown by using, for example, the CVD method so that a cell plate 12 is formed and thus a stacked type capacitor 13 is formed. As a result, the semiconductor device having the structure shown in FIG. 1 is obtained.

Since the fourth embodiment is arranged as described above, the ends of the storage node 10 on the interlayer insulating film 9 can be made to be symmetrical with respect to the contact hole 9a.

Since the single crystal silicon grown from the silicon substrate 1 through the contact hole 9a is used to form the storage node 10, an error occurring when stacking is performed in the photolithography process which is performed when the etching mask is formed for forming the ends of the storage node 10 on the interlayer insulating film 9 can be prevented. Therefore, the capacitor 13 can be formed precisely.

The fourth embodiment is able to form the storage node 10 made of single crystal silicon attributable to the vapor-phase epitaxial growth from the silicon substrate 1. Therefore, the bearing of crystal in the silicon substrate 1 and the storage node 10 in the storage node contact 10a can be made to be the same. Therefore, the contact resistance in the storage node contact 10a can be reduced.

Since the storage node 10 is, in the fourth embodiment, made of single crystal silicon, the surface of the storage node 10 formed opposite to the cell plate 12 across the dielectric film 11 can be flattened as compared with the conventional structure in which polycrystal silicon is employed.

Therefore, concentration of electric fields into the surface of the storage node 10 in the capacitor 13 can be prevented. As a result, the reliability of the semiconductor device can be improved.

The fourth embodiment has the arrangement such that the single crystal silicon 10d formed by the vapor phase epitaxial growth is embedded in the contact hole 9a, and then the amorphous silicon 10b is formed, and then a portion of the amorphous silicon 10b is formed into single crystal. Therefore, a problem that the amorphous silicon 10b on the third interlayer insulating film 93 is undesirably formed into polycrystal during the process of forming the inside portion of the contact hole 9a into single crystal can be prevented as compared with the first to third embodiments. Thus, an effect can be obtained in that the storage node 10 can easily be formed into a required shape.

Although the fourth embodiment is arranged such that the contact hole 9a is filled up by the single crystal silicon 10d formed by the vapor phase growth, a concave portion may be left in place of completely filling the contact hole in a range with which the amorphous silicon 10b on the interlayer insulating film 9 is not formed into polycrystal silicon and the storage node 10 can be formed into a required shape, followed by forming the amorphous silicon 10b and performing the single-crystallization.

Similarly, a process may be employed in which the contact hole 9a is filled up and then the vapor-phase epitaxial layer 10d is formed to extend on the third interlayer insulating film 93. Also in this case, an effect similar to that obtainable from the foregoing case can be obtained.

Since the fourth embodiment has the arrangement in which the amorphous silicon 10b is continuously deposited in a low pressure atmosphere without exposure to the atmosphere after the vapor phase epitaxial layer 10d has been grown, a naturally-oxidized film formed on the surface of the silicon substrate 1 exposed to the bottom surface of the contact hole after the contact hole 9a has been formed is covered because the vapor phase epitaxial layer 10d is formed. Therefore, an influence of the naturally-oxidized film on the single crystallization can be prevented when the amorphous silicon 10b is single-crystallized by using the solid-phase epitaxial growth method.

Although the fourth embodiment has the step of performing implantation of ions of the impurity after the solid-phase epitaxial growth has been performed, implantation of ions may be performed after the amorphous silicon 10b has been formed and before the solid-phase epitaxial growth is performed. In this case, the growing rate in the solid-phase epitaxial growth can be raised.

As an alternative to this, a method similar to that according to the third embodiment may be employed in which the impurity is added by using impurity gas in the step of forming the amorphous silicon 10b, and then heat treatment which is performed when the solid-phase epitaxial growth is carried out is used to diffuse the impurity added to the amorphous silicon 10b into the portion in the vapor phase epitaxial layer 10d which has been formed by the solid-phase epitaxial growth. Also in this case, an effect similar to that obtainable from the above-mentioned case can be obtained.

Although the fourth embodiment has the step of implanting phosphorus ions to make the non-doped vapor phase epitaxial layer 10d to be conductive, arsenic ions may be implanted in place of phosphorus. Also in this case, an effect similar to that obtainable from the above-mentioned case can be obtained.

In the method of manufacturing a semiconductor device according to the present invention, an error in stacking which is performed in the photolithography process for forming the etching mask for determining the shape of the electrode on the layer insulation film can be prevented. Thus, the capacitative device having the electrode can be formed precisely. Another effect can be obtained in that undesirable polycrystallization of the amorphous silicon on the layer insulation film during single-crystallization of the inside portion of the connection hole can be prevented and thus an electrode having a desired shape can easily be obtained.

Since the characteristic lies in that the step of forming the amorphous silicon layer uses a chemical vapor growth method which uses gas containing impurities, the necessity of implanting ions of the impurity can be eliminated. Thus, an effect can be obtained in that the number of the manufacturing processes can be reduced.

The present invention is characterized in that a photolithography technique using a mask for photolithography is used in the step of forming, in the interlayer insulating film, the contact hole in contact with the surface of the silicon substrate, and the step of growing the single crystal silicon by forming the amorphous silicon layer into the single crystal silicon includes a step of forming an ion implantation preventing film on the amorphous silicon layer, a step of forming the ion implantation preventing film by using the photolithography technique using a mask for photolithography into a required shape and a step of implanting an impurity into the amorphous silicon layer by using the ion implantation preventing film formed into the required shape as a mask. Therefore, an effect can be obtained in that epitaxial growth is selectively performed in the portion of the amorphous silicon into which the impurity has been implanted, thus the size and shape of the electrode can be controlled and also reproducibility can easily be maintained. Moreover, the margin permitted for the heat treatment conditions for the epitaxial growth can be enlarged.

Since the characteristic lies in that the impurity is arsenic or boron, an effect can be obtained in that single-crystallization of the amorphous silicon layer can be enhanced.

Since the characteristic lies in that the step of growing the single crystal silicon by forming the amorphous silicon layer into the single crystal silicon is performed such that the single crystal silicon is grown on the interlayer insulating film, an effect can be obtained in that the capacity of the capacitor having the electrode made of single crystal silicon can be obtained.

Since the method comprises a step of forming a dielectric film on the surface of the electrode and a step of forming another electrode at a position opposite to the electrode across the dielectric film, the capacitor can be formed. Since the electrode is made of single crystal silicon, the surface of the electrode can be flattened as compared with the conventional method using polycrystal silicon. Therefore, concentration of electric fields into the surface of the electrode in the capacitor can be prevented. As a result, an effect can be obtained in that the reliability of the semiconductor device can be improved.

What is claimed is:

1. A method of manufacturing a semiconductor device comprising the steps of:

forming an interlayer insulating film on a silicon substrate;

forming a contact hole in the interlayer insulating film so as to be in contact with the surface of the silicon substrate;

filling the contact hole up by forming single crystal silicon;

forming an amorphous silicon layer in the contact hole, in which the single crystal silicon has been embedded, and on the interlayer insulating film;

growing a single crystal silicon by subjecting the amorphous silicon layer to heat treatment to form the amorphous silicon layer into single crystal silicon selectively by performing solid-phase epitaxial growth which uses the single crystal silicon as a seed; and forming an electrode made of the single crystal silicon by selectively removing a portion of said amorphous silicon layer except for a single-crystallized portion of the amorphous silicon by selective etching based upon a difference in the etching rate between the crystallized silicon and uncrystallized silicon.

2. The method of manufacturing a semiconductor device as claimed in claim 1, wherein the step of filling the contact hole comprises a step of selectively depositing single crystal silicon on the surface of the silicon substrate exposed to the bottom surface of the contact hole as a seed by the method of vapor epitaxial growth.

3. The method of manufacturing a semiconductor device as claimed in claim 1, wherein the step of forming an electrode comprised a step of selectively removing the non-crystalized amorphous silicon by dry etching.

4. The method of manufacturing a semiconductor device as claimed in claim 1, wherein the step of forming an amorphous silicon layer comprises a chemical vapor deposition step using an impurity containing gas.

5. The method of manufacturing a semiconductor device according to claim 1, wherein the step of forming a contact hole comprising a photolithography process using a mask for photolithography, in the interlayer insulating film, and the step of growing the single crystal silicon comprises a step of forming an ion implantation preventing film on the amorphous silicon layer, a step of forming the ion implantation preventing film by using the photolithography technique using a mask for photolithography into a required pattern and a step of implanting an impurity into the amorphous silicon layer by using the ion implantation preventing film formed into the required shape as a mask.

6. The method of manufacturing a semiconductor device according to claim 5, wherein the impurity is one of arsenic and boron.

7. The method of manufacturing a semiconductor device according to claim 5, wherein the step of growing the single crystal silicon by crystalizing the amorphous silicon layer into the single crystal silicon is performed such that the single crystal silicon is grown up not only inside the contact hole but on the interlayer insulating film.

8. The method of manufacturing a semiconductor device according to claim 1, further comprising a step of forming a dielectric film on the surface of the electrode and a step of forming another electrode facing to the electrode across the dielectric film.

9. The method of manufacturing a semiconductor device as claimed in claim 1, wherein the step of filling the contact hole comprises a step of growing single crystal silicon by forming the amorphous silicon layer into single crystal silicon by performing solid-phase epitaxial growth from the surface of the silicon substrate exposed to the bottom surface of the contact hole as a seed by subjecting the amorphous silicon layer to heat treatment.

10. A method of manufacturing a semiconductor device comprising the steps of:

forming an interlayer insulating film on a silicon substrate;

forming a contact hole in the interlayer insulating film so as to be in contact with the surface of the silicon substrate;

forming an amorphous silicon layer in the inside portion of the contact hole including the surface of the silicon substrate exposed to the bottom surface of the contact hole and on the interlayer insulating film;

growing single crystal silicon by forming the amorphous silicon layer into single crystal silicon selectively by performing solid-phase epitaxial growth from the surface of the silicon substrate exposed to the bottom surface of the contact hole as a seed by subjecting the amorphous silicon layer to heat treatment; and forming an electrode made of the single crystal silicon by removing a portion of the amorphous silicon layer except for a single-crystallized portion of the amorphous silicon by selective etching based upon a difference in the etching rate between the crystallized silicon and uncrystallized silicon.

11. The method of manufacturing a semiconductor device as claimed in claim 10, wherein the step of forming an electrode comprised a step of selectively removing the non-crystalized amorphous silicon by dry etching.

12. The method of manufacturing a semiconductor device as claimed in claim 10, wherein the step of forming an amorphous silicon layer comprises a chemical vapor deposition step using an impurity containing gas.

13. The method of manufacturing a semiconductor device according to claim 10, wherein the step of forming a contact hole comprising a photolithography process using a mask for photolithography, in the interlayer insulating film, and the step of growing the single crystal silicon comprises a step of forming an ion implantation preventing film on the amorphous silicon layer, a step of forming the ion implantation preventing film by using the photolithography technique using a mask for photolithography into a required pattern and a step of implanting an impurity into the amorphous silicon layer by using the ion implantation preventing film formed into the required shape as a mask.

14. The method of manufacturing a semiconductor device according to claim 13, wherein the impurity is one of arsenic and boron.

15. The method of manufacturing a semiconductor device according to claim 13, wherein the step of growing the single crystal silicon by crystalizing the amorphous silicon layer into the single crystal silicon is performed such that the single crystal silicon is grown up not only inside the contact hole but on the interlayer insulating film.

16. The method of manufacturing a semiconductor device according to claim 10, further comprising a step of forming a dielectric film on the surface of the electrode and a step of forming another electrode facing to the electrode across the dielectric film.

* * * * *